METHOD OF MANUFACTURING SILICON DIODES OR SILICON TRANSISTORS BY ALLOYING INDIUM WITH P-TYPE SILICON TO PRODUCE A P-N JUNCTION
Filed Sept. 30, 1963
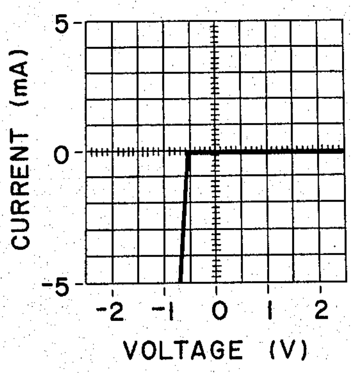
INVENTOR.
Masatoshi Migitaka
Takashi Tokuyama
BY
Mesken and Mesken United States Patent Office 3,285,791

Patented Nov. 15, 1966

3,285,791

METHOD OF MANUFACTURING SILICON DIODES OR SILICON TRANSISTORS BY ALLOYING INDIUM WITH P-TYPE SILICON TO PRODUCE A P-N JUNCTION

Masatoshi Migitaka and Takashi Tokuyama, both of Kitatama-gun, Tokyo-to, Japan, assignors to Kabushiki Kaisha Hitachi Seisakusho, Chiyoda-ku, Tokyo-to, Japan, a joint-stock company of Japan Filed Sept. 30, 1963, Ser. No. 312,739

Claims priority, application Japan, Oct. 4, 1962, 37/42,934

4 Claims. (Cl. 148—177)

This invention relates to techniques in the manufacture of silicon diodes or transistors, and more particularly it relates to a new method of forming junctions with goods rectification on p-type silicon through the use of indium.

As is well known, since indium is a group III impurity, when it is introduced into silicon, it imparts thereto a p-type conductivity. Therefore, the formation of a junction through the use of indium on a p-type silicon produces only a $p^+p$ junction, and it has heretofore been considered that, with the exception of the case of a p-type single crystal of high resistivity, junctions of very good rectification could not be expected from this method.

However, as a result of experimental research conducted by the present inventors, it has been found that, when indium is alloyed with a p-type silicon to form a junction, the resulting regrowth layer containing indium exhibits properties similar to those of the n-type, and rectification characteristic appears, and that, particularly in the case wherein the resistivity of the p-type silicon is low, excellent characteristics are exhibited by the resulting junction. Furthermore, the fact that the regrowth layer exhibits n-type-like characteristics has been further verified by the discovery that the thermoelectric power of the regrowth layer exhibits n-type characteristics. The theory for the reason why the regrowth layer containing indium exhibits n-type-like characteristics is not yet clear. However, one hypothesis is that, in the regrowth layer of silicon formed at the time of alloying with indium, since the atomic radius of indium is 1.58 angstroms which is substantially higher than the silicon atomic radius (1.17 angstroms), the normal growth of the crystal is obstructed, and an irregularity in the crystallization of the regrowth layer occurs.

It is an object of the present invention to provide a new method of producing silicon diodes or transistors which is based on the above-stated findings.

It is another object to provide a method as defined above which can be accomplished in a relatively simple manner to produce silicon diodes or transistors having highly desirable characteristics.

The foregoing objects, as well as other objects and advantages, have been achieved by the present invention, which, briefly described, contemplates a method which comprises causing indium to alloy with a p-type silicon substratum at a temperature below the melting point of silicon in an atmosphere of an inactive gas or a reducing gas so as to form a rectifying junction of the p-n type.

The nature and details of the invention will be more clearly apparent by reference to the following example of preferred embodiment of the invention, when taken in conjunction with the accompanying drawing, which is a graphical representation indicating the voltage-current curve of a silicon diode produced by the method of the invention.

A so-called dot of indium was placed on a p-type silicon, single-crystal wafer having a resistivity of 0.9 ohm-cm., which was then placed in a graphite jig. The materials so assembled and supported in the jig were then heated in a furnace, in a stream of hydrogen gas, at a temperature of 1,200 degrees centigrade for 5 minutes, after which the materials were cooled at a rate of 20 degrees centigrade per minute. The semiconductor device so produced exhibited a rectification characteristic whereby, as indicated in the drawing, a forward bias is produced when the indium side is placed under negative potential.

In the method according to the present invention, the resistivity of the p-type silicon single crystal need not be limited to 0.9 ohm-cm. Furthermore, while the range of alloying temperature is preferably in the range below the melting point of silicon, the alloying time and the rate of cooling may be varied. Moreover, the indium need not be ultra-pure an indium containing small quantities of n-type or p-type impurity being suitable for the purposes of this invention without detrimental effect.

When soft indium is used for producing diodes according to this invention, the possibility of cracks due to differences in coefficient of thermal expansion occurring in the junction parts is substantially reduced, and variations in characteristics due to temperature cycles are decreased. Accordingly, when applied to junctions of large area for high-power diodes, the method of the present invention is highly effective.

While in the foregoing disclosure, the invention has been described principally with respect to the case of its application to diodes, it will be apparent that the invention may be applied to transistors with equally high effectiveness.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention as set forth in the appended claims.

What is claimed is:

1. A method of producting a silicon diode which comprises alloying indium with a p-type silicon substrate at a temperature below the melting point of silicon, thereby obtaining a p-n junction.

2. A method of producing a silicon diode which comprises alloying indium with a p-type silicon substrate at a temperature below the melting point of silicon, in a stream of a gas preventing oxidation, for substantially 5 minutes, cooling the reaction mixture at a rate of approximately 20° C. per minute, thereby obtaining a p-n junction.

3. A method of producing a silicon diode which comprises alloying indium with a p-type silicon by placing a dot of said indium on a p-type silicon single crystal wafer; heating this assembly, in a stream of hydrogen gas, for substantially 5 minutes at essentially 1,200° C.; and cooling it at a rate of 20° C. per minute; thereby obtaining a p-n junction.

4. A method of producing a silicon diode which comprises alloying indium with silicon by placing a dot of said indium on a single crystal wafer of p-type silicon; heating this assembly, in a stream of hydrogen gas, for substantially 5 minutes at essentially 1,200° C.; and cooling it at a rate of approximately 20° C. per minute; thereby obtaining a p-n junction; said diode having a forward bias when the indium is placed under a negative potential.

References Cited by the Examiner

UNITED STATES PATENTS

| | | | |
|---|---|---|---|
| 2,857,527 | 10/1958 | Pankove | 317—235 |
| 2,931,958 | 4/1960 | Arthur et al. | 307—88.5 |

HYLAND BIZOT, *Primary Examiner.*

R. O. DEAN, *Assistant Examiner.*